(12) United States Patent
Chen et al.

(10) Patent No.: US 8,058,720 B2
(45) Date of Patent: Nov. 15, 2011

(54) SEMICONDUCTOR PACKAGE

(75) Inventors: Nan-Jang Chen, Hsinchu (TW); Yau-Wai Wong, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/273,559

(22) Filed: Nov. 19, 2008

(65) Prior Publication Data

US 2010/0123226 A1  May 20, 2010

(51) Int. Cl.
*H01L 23/495* (2006.01)

(52) U.S. Cl. . 257/691; 257/666; 257/670; 257/E23.031; 257/E23.043; 257/E23.079; 361/773; 361/813

(58) Field of Classification Search .......... 257/670, 257/E23.031, E23.043, 666, 691, E23.079; 361/773, 813

See application file for complete search history.

(56) References Cited

U.S. PATENT DOCUMENTS

| | | | |
|---|---|---|---|
| 6,388,311 B1 * | 5/2002 | Nakashima et al. | 257/676 |
| 6,437,427 B1 * | 8/2002 | Choi | 257/666 |
| 6,627,977 B1 * | 9/2003 | Foster | 257/666 |
| 6,630,373 B2 | 10/2003 | Punzalan et al. | |
| 6,876,069 B2 | 4/2005 | Punzalan et al. | |
| 7,230,323 B2 | 6/2007 | Lee et al. | |
| 7,242,077 B2 | 7/2007 | Ma et al. | |
| 2003/0160309 A1 * | 8/2003 | Punzalan et al. | 257/676 |
| 2004/0061204 A1 * | 4/2004 | Han et al. | 257/666 |
| 2004/0238921 A1 * | 12/2004 | Lee et al. | 257/666 |
| 2005/0029638 A1 * | 2/2005 | Ahn et al. | 257/676 |

FOREIGN PATENT DOCUMENTS

KR  20020007875 A  1/2002

* cited by examiner

*Primary Examiner* — Eugene Lee
*Assistant Examiner* — Peniel M Gumedzoe
(74) *Attorney, Agent, or Firm* — Winston Hsu; Scott Margo

(57) ABSTRACT

A semiconductor package includes a die pad; a semiconductor die mounted on the die pad; a plurality of leads in a first horizontal plane disposed along peripheral edges of the die pad; a ground bar downset from the first horizontal plane to a second horizontal plane between the leads and the die pad; a plurality of downset tie bars connecting the ground bar with the die pad; a plurality of ground wires bonding to both of the ground bar and the die pad; and a molding compound at least partially encapsulating the die pad, inner ends of the leads such that bottom surface of the die pad is exposed within the molding compound.

17 Claims, 5 Drawing Sheets

SEMICONDUCTOR PACKAGE

BACKGROUND OF THE INVENTION

1. Field of the Invention

This invention relates generally to packaging of semiconductors, and in particular, to a leadframe semiconductor package.

2. Description of the Prior Art

Leadframe semiconductor packages are well known in the art. A conventional leadframe typically includes a plurality of metal leads temporarily held together in a planar arrangement about a central region during package manufacture by a rectangular frame. A die pad is supported in the central region by a plurality of tie bars that attach to the frame. The leads extend from a first end integral with the frame to an opposite second end adjacent to, but spaced apart from, the die pad.

During package manufacture, a semiconductor die is attached to the die pad. Wire-bonding pads on the die are then connected to selected ones of the inner ends of the leads by fine, conductive bonding wires to convey power, ground or signals between the die and the leads. A protective body of an epoxy resin is molded over the assembly to enclose and seal the die, the inner ends of the leads, and the wire bonds against harmful environmental elements. The rectangular frame and the outer ends of the leads are left exposed outside of the body, and after molding, the frame is cut away from the leads and discarded, and the outer ends of the leads are appropriately formed for interconnection of the package with an external printed circuit board.

One known type of the leadframe semiconductor packages is the so-called exposed die pad (E-pad) leadframe package that exposes the bottom surface of the die pad to the outside of the encapsulation body. The exposed die pad acts as a heat sink and can improve the heat-dissipation efficiency. Typically, the exposed die pad is electrically connected to a ground plane of the external printed circuit board.

It has been found that the E-pad leadframe package is subject to attacks of moisture. To avoid reliability problems due to moisture attacks and delamination along the plastic body-metal interface, the ground wires extended from the ground pads of the semiconductor die are not directly bonded onto the surface of the die pad, but instead the ground wires are bonded to a rectangular ring shaped ground bridge bar that encircles the die pad at different downset planes. Typically, the ground bridge bar is supported by tie bars that connected with the die pad.

However, the prior art leadframe package with such ground bridge bar configuration has a shortcoming of that the analog and digital ground wires randomly bonded together onto the ground bridge bar can result in noise or ground coupling, which is also known as water wave effects in TV systems. Another shortcoming is that the ground bridge bar is vulnerable to twist and deform, leading to poor bonding strength. It is therefore desirable to provide an improved leadframe package structure that may eliminate the aforesaid digital and analog ground coupling and the water wave effects in TV systems.

SUMMARY OF THE INVENTION

It is one objective of this invention to provide an improved semiconductor package structure with improved performance and reduced ground coupling.

To these ends, according to one aspect of the present invention, there is provided a semiconductor package including a die pad; a semiconductor die mounted on the die pad; a plurality of leads in a first horizontal plane disposed along peripheral edges of the die pad; a ground bar downset from the first horizontal plane to a second horizontal plane between the leads and the die pad; a plurality of downset tie bars connecting the ground bar with the die pad; a plurality of ground wires bonding to both of the ground bar and the die pad; and a molding compound at least partially encapsulating the die pad, inner ends of the leads such that bottom surface of the die pad is exposed within the molding compound.

In one aspect, a semiconductor package includes a die pad; a semiconductor die mounted on the die pad; a plurality of leads in a first horizontal plane disposed along peripheral edges of the die pad; a first ground bar downset from the first horizontal plane to a second horizontal plane; a second ground bar flush with the leads; a first downset tie bar connecting the first ground bar to the die pad; a second downset tie bar connecting the second ground bar with the first ground bar; a plurality of first ground wires for conveying digital ground bonding to the first ground bar; a plurality of second ground wires for conveying analog ground bonding to the second ground bar; and a molding compound at least partially encapsulating the die pad, inner ends of the leads such that bottom surface of the die pad is exposed within the molding compound.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
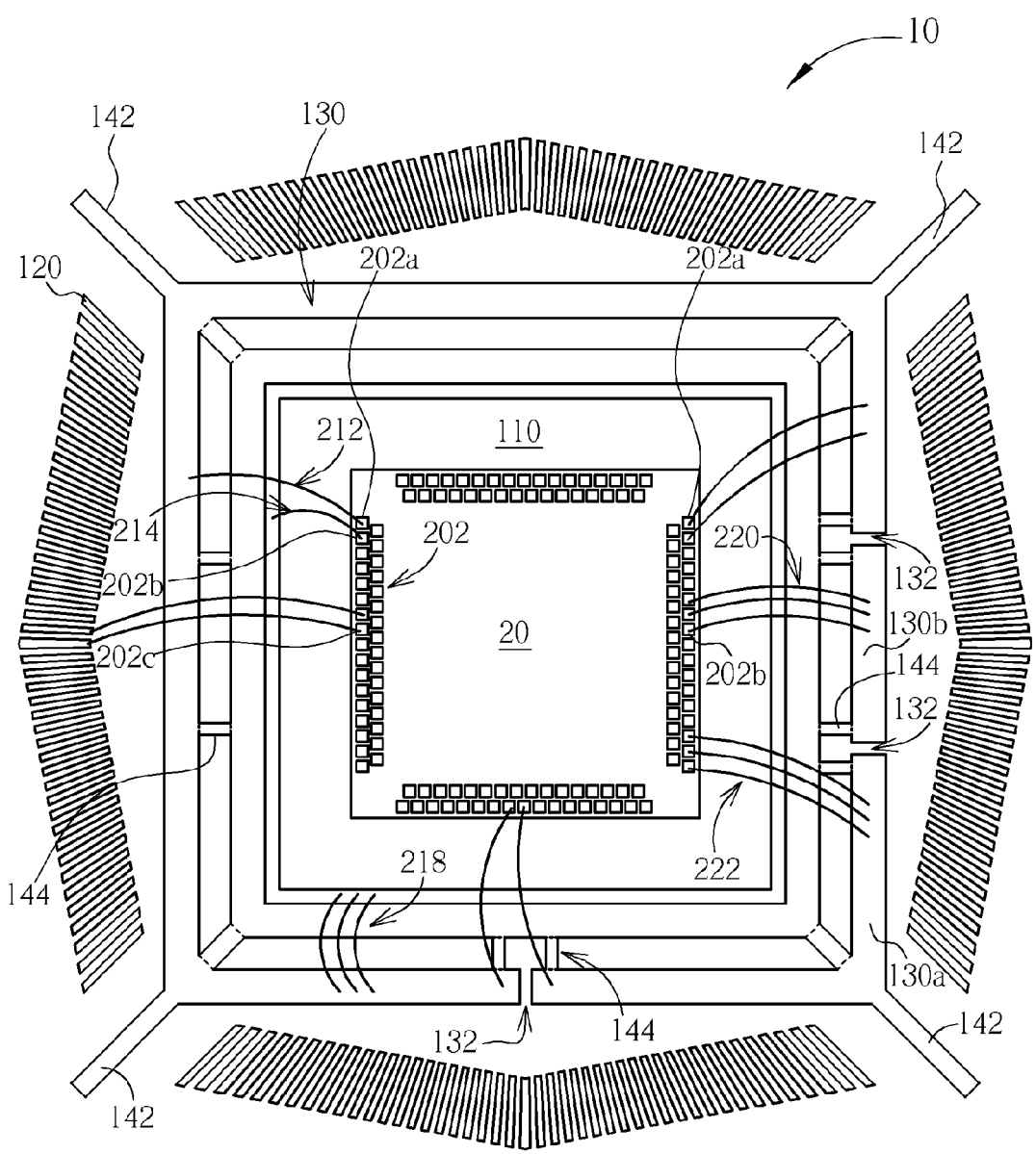
FIG. 1 is a top view of a semiconductor package according to one embodiment of the present invention.

The technology trend in the consumer electronics can be summarized as more functionalities in a smaller geometry with low cost. The exposed pad low-profile quad flat package (E-pad LQFP) is a low cost solution for multimedia chips, but its disadvantages are limited pin count and worse electrical characteristics.

As previously mentioned, one problem relates to delamination of the leadframe components from the plastic package body, and the attendant problem of penetration of the package by moisture. In particular, the various parts of a semiconductor package experience greatly different amounts of thermal expansion and contraction with temperature changes due to the relatively large differences in the coefficients of thermal expansion of their respective materials, e.g., metal, epoxy resin, and silicon. As a result, the leadframe components can become delaminated from the package body with temperature cycling of the package during manufacture or operation.

Where delamination occurs at a boundary of the package body, a microscopic crack is created for the penetration of the package by moisture. The moisture can corrode metallization present in its path, resulting in subsequent current leakage through the corrosive path. To avoid reliability problems due to moisture attacks and delamination, the ground wires are typically not bonded onto the surface of the die pad. Instead, the ground wires, either digital ground wires or analog ground wires, are bonded to a ground bridge bar that encircles the die pad at different downset planes. However, such configuration results in ground signal coupling noise. The present invention addresses this problem.

One or more implementations of the present invention will now be described with reference to the attached drawings, wherein like reference numerals are used to refer to like elements throughout, and wherein the illustrated structures are not necessarily drawn to scale.

Figure 2:
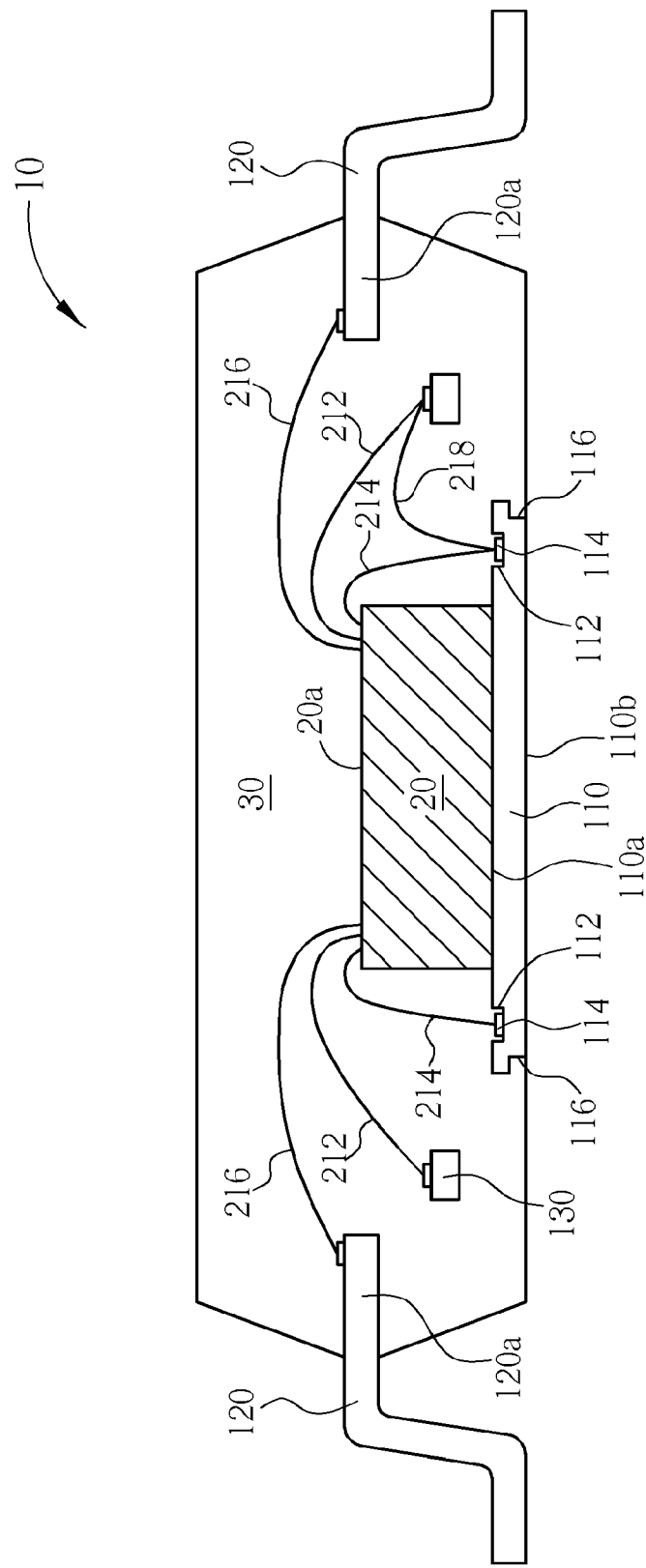
FIG. 2 is a schematic, cross-sectional view of the semiconductor package of FIG. 1.

FIG. 1 is a top view of a semiconductor package according to one embodiment of the present invention. FIG. 2 is a schematic, cross-sectional view of the semiconductor package of FIG. 1. As shown in FIG. 1 and FIG. 2, according to the first embodiment of this invention, a semiconductor package 10 comprises a semiconductor die 20 mounted onto the first surface 110a of a die pad 110, a plurality of leads 120 in a first horizontal plane disposed along the peripheral edges of the die pad 110, a ground bar 130 downset from the first horizontal plane to a second horizontal plane between inner ends 120a of the leads 120 and the die pad 110, four connecting bars 142 extending outward from four corners of the die pad 110, and a plurality of downset tie bars 144 connecting the ground bar 130 with the die pad 110. A molding compound 30 at least partially encapsulating the die pad 110, the inner ends 120a of the leads 120 such that the bottom surface 110b of the die pad 110 is exposed within the molding compound 30.

According to this embodiment, a peripheral groove 112 is etched into the first surface 110a of the die pad 110 and is disposed around the semiconductor die 20. A plating layer 114 such as silver or noble metals may be formed within the peripheral groove 112 for wire bonding purposes. The peripheral groove 112 can increase the coupling strength. To securely lock the leadframe components to the plastic body of the package, thereby effectively reducing both the amount of delamination of the leadframe from the body and the resulting penetration of the body by moisture, the bottom surface 110b of the die pad 110 may be partially etched along the periphery of the die pad 110 to form a step 116.

The semiconductor die 20 comprises a plurality of bonding pads 202 on its active surface 20a. The bonding pads 202 further comprise a plurality of first ground pads 202a and a plurality of second ground pads 202b. According to this embodiment, the plurality of first ground pads 202a are sensitive analog ground pads, while the plurality of second ground pads 202b are digital ground pads. In another embodiment, the plurality of first ground pads 202a are digital ground pads, while the plurality of second ground pads 202b are sensitive analog ground pads.

A plurality of first bonding wires 212 are provided to connect the respective first ground pads 202a to the ground bar 130. A plurality of second bonding wires 214 are provided to connect the respective second ground pads 202b to the plated top surface of the peripheral groove 112. A plurality of third bonding wires 216 are provided to connect the bond pads 202c such as signal or power pads to the leads 120. According to this embodiment, a plurality of fourth bonding wires 218 are provided to connect the die pad 110 with the ground bar 130 in order to reduce the ground inductance. By separating the digital ground path from the analog ground path, the sensitive analog ground signal is not interfered by the digital ground signal during operation and the water wave effect can be eliminated.

The ground bar 130 may have a continuous ring shape. However, the present invention is not limited thereto. Discontinuities 132 may be provided in the ground bar 130, thereby forming separated ground bar segments 130a and 130b. Each of the ground bar segments 130a and 130b are supported by respective tie bars 144. A plurality of fifth bonding wires 220 are provided to connect the first ground pads 202a to the ground bar segment 130a. A plurality of sixth bonding wires 222 are provided to connect the second ground pads 202b to the ground bar segment 130b. Since the digital ground path is separated from the analog ground path by wire bonding to separate ground bar segments 130a and 130b, the sensitive analog ground signal is not interfered by the digital ground signal.

Figure 3:
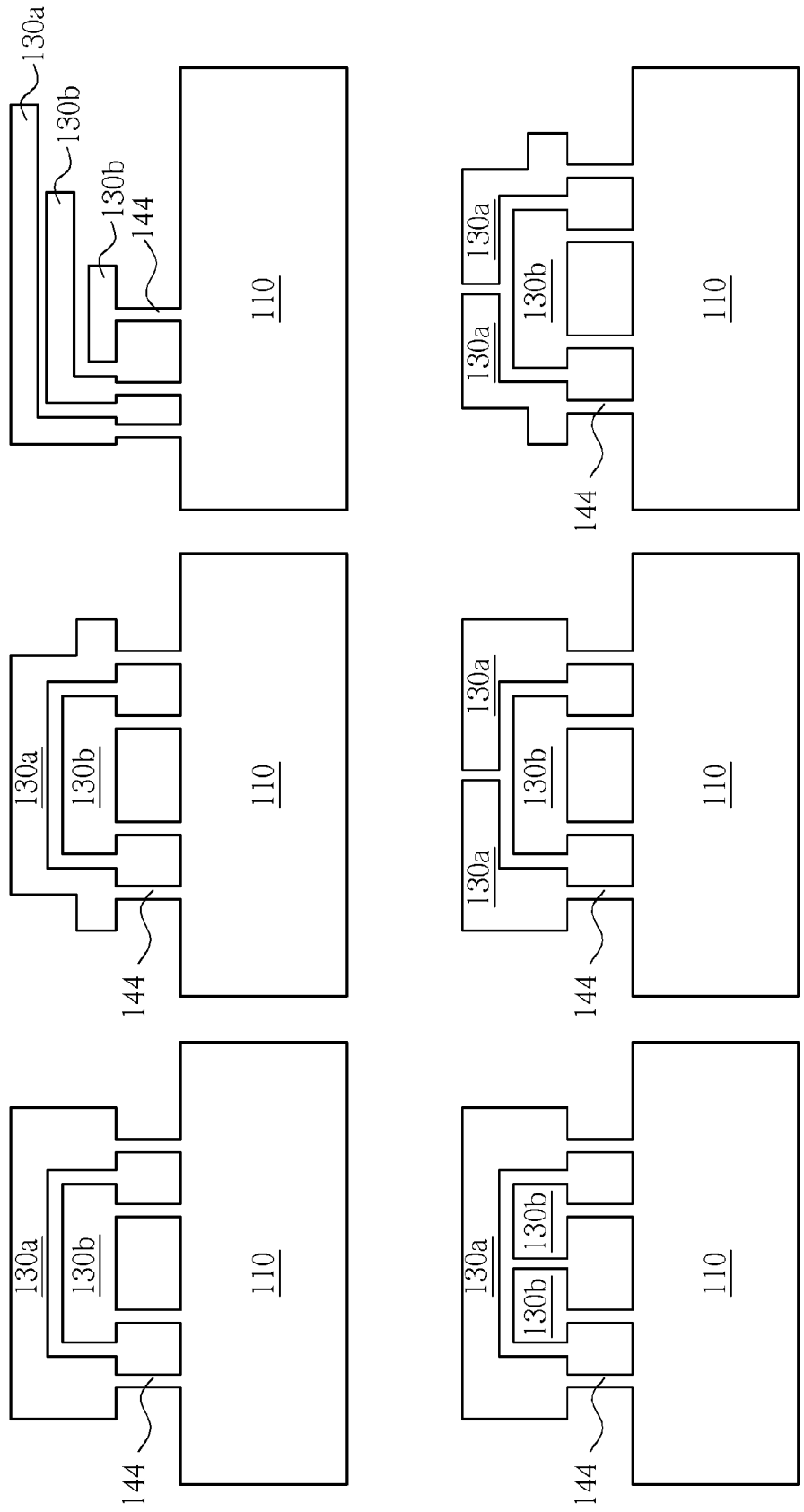
FIG. 3 shows some examples of the separated ground bar segments according to this invention.

The separated ground bar segments may have various shapes, for example, T shape, U shape, Π shape, L shape, serpentine shape or irregular shapes. FIG. 3 shows some examples of the separated ground bar segments according to this invention. It is one germane feature of the present invention that the bonding wires for conveying digital ground signal are boned to one of the separated ground bar segments, while the bonding wires for conveying analog ground signal are bonded to the other. In doing so, the interference between the digital ground and the analog ground is avoided.

Figure 4:
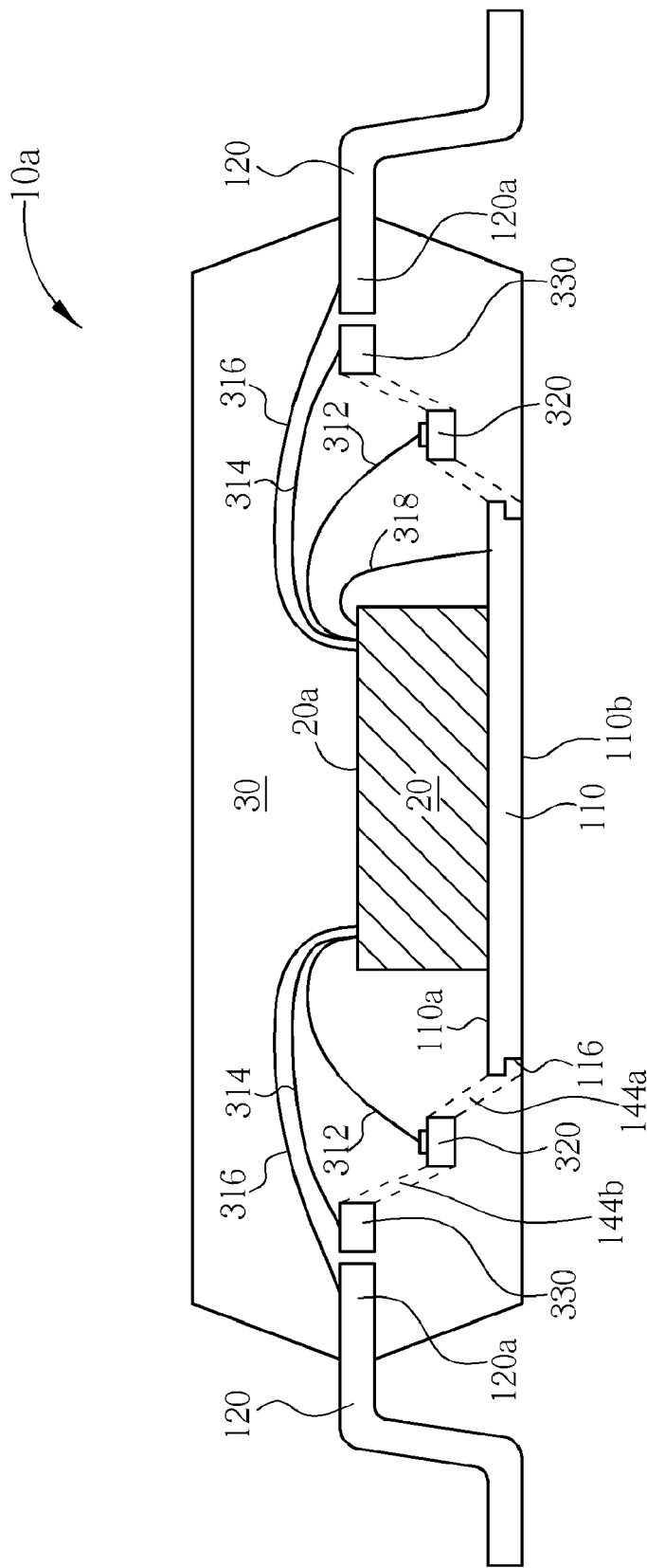
FIG. 4 is a schematic, cross-sectional view of a semiconductor package in accordance with another embodiment of this invention.
Figure 5:
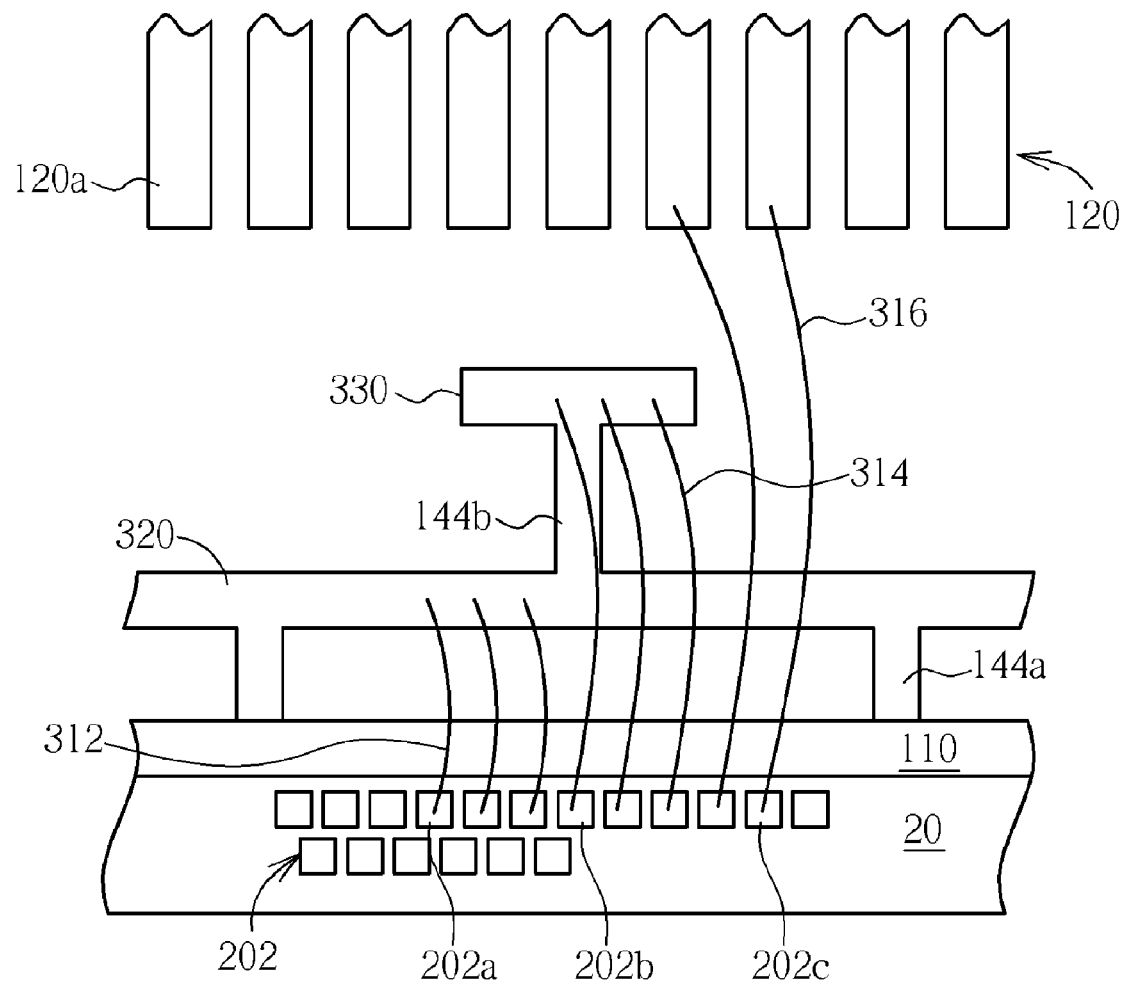
FIG. 5 is a partial plan view of the semiconductor package in FIG. 4.

FIG. 4 is a schematic, cross-sectional view of a semiconductor package 10a in accordance with another embodiment of this invention. FIG. 5 is a partial plan view of the semiconductor package in FIG. 4. As shown in FIG. 4 and FIG. 5, likewise, the semiconductor package 10a comprises a semiconductor die 20 mounted onto the first surface 110a of a die pad 110, a plurality of leads 120 in a first horizontal plane disposed along the peripheral edges of the die pad 110, a ground bar 320 downset from the first horizontal plane to a second horizontal plane between inner ends 120a of the leads 120 and the die pad 110, and a plurality of downset tie bars 144a connecting the ground bar 320 with the die pad 110.

An extended ground bar 330 that is flush with the plurality of leads 120 in the first horizontal plane is provided between the inner ends 120a of the leads 120 and the ground bar 320. The extended ground bar 330 is supported by the downset tie bar 144b that connects to the ground bar 320. A molding compound 30 at least partially encapsulating the die pad 110, the inner ends 120a of the leads 120 such that the bottom surface 110b of the die pad 110 is exposed within the molding compound 30.

To securely lock the leadframe components to the plastic body of the package, thereby effectively reducing both the amount of delamination of the leadframe from the body and the resulting penetration of the body by moisture, the bottom surface 110b of the die pad 110 may be partially etched along the periphery of the die pad 110 to form a step 116. In addition, a peripheral groove may be etched into the first surface 110a of the die pad 110 to improve the interlock between the molding compound 30 and the die pad 110.

The semiconductor die 20 comprises a plurality of bonding pads 202 on its active surface 20a. The bonding pads 202 further comprise a plurality of first ground pads 202a and a plurality of second ground pads 202b. According to this embodiment, the plurality of first ground pads 202a are digital ground pads, while the plurality of second ground pads 202b are sensitive analog ground pads. A plurality of first bonding wires 312 are provided to connect the respective first ground pads 202a to the ground bar 320. A plurality of second bonding wires 314 are provided to connect the respective second ground pads 202b to the extended ground bar 330. A plurality of third bonding wires 316 are provided to connect the bond pads 202c such as signal or power pads to the leads 120. Optionally, a plurality of fourth bonding wires 318 are provided to connect the die pad 110 with the die 20. By separating the digital ground path from the analog ground path, the sensitive analog ground signal is not interfered by the digital ground signal during operation and the water wave effect can be eliminated.

Those skilled in the art will readily observe that numerous modifications and alterations of the device and method may be made while retaining the teachings of the invention.

What is claimed is:

1. A semiconductor package, comprising:
   a die pad;
   a semiconductor die mounted on the die pad;
   a plurality of leads in a first horizontal plane disposed along peripheral edges of the die pad;
   a ground bar downset from the first horizontal plane to a second horizontal plane between the leads and the die pad;
   a plurality of downset tie bars connecting the ground bar with the die pad;
   a set of first ground wires directly electrically connected to the semiconductor die and the ground bar;
   a set of second ground wires directly electrically connected to the semiconductor die and the die pad; and
   a molding compound at least partially encapsulating the die pad, inner ends of the leads such that bottom surface of the die pad is exposed within the molding compound.

2. The semiconductor package according to claim 1 wherein the first ground wires are analog ground and the second ground wires are digital ground.

3. The semiconductor package according to claim 2 wherein the first ground wires are directly bonded to the ground bar and the second ground wires are directly bonded to the die pad.

4. The semiconductor package according to claim 3 wherein the second ground wires are bonded to a peripheral groove partially etched into the die pad.

5. The semiconductor package according to claim 2 wherein the first and second ground wires are all bonded to the ground bar, and wherein at least one discontinuity is provided in the ground bar to separate the first ground wires from the second ground wires.

6. The semiconductor package according to claim 1 further comprising a plurality of signal wires provided to connect signal pads on the semiconductor die to the leads.

7. The semiconductor package according to claim 1 further comprising a plurality of power wires provided to connect power pads on the semiconductor die to the leads.

8. The semiconductor package according to claim 1 wherein the ground bar has T shape, U shape, Π shape, L shape, serpentine shape or irregular shapes.

9. The semiconductor package according to claim 1 wherein a plurality of bonding wires extend between the die pad and the ground bar.

10. A semiconductor package, comprising:
    a die pad;
    a semiconductor die mounted on the die pad;
    a plurality of leads in a first horizontal plane disposed along peripheral edges of the die pad;
    a first ground bar downset from the first horizontal plane to a second horizontal plane;
    a second ground bar flush with and separated from the leads;
    a first downset tie bar connecting the first ground bar to the die pad;
    a second downset tie bar connecting the second ground bar with the first ground bar;
    a plurality of first ground wires for conveying digital ground directly and electrically connected to the first ground bar;
    a plurality of second ground wires for conveying analog ground directly and electrically connected to the second ground bar; and
    a molding compound at least partially encapsulating the die pad, inner ends of the leads such that bottom surface of the die pad is exposed within the molding compound.

11. The semiconductor package according to claim 10 wherein a plurality of third bonding wires are provided to connect signal or power pads to the leads.

12. The semiconductor package according to claim 10 wherein a plurality of fourth bonding wires are provided to connect the semiconductor die with the die pad.

13. A semiconductor package, comprising:
    a die pad;
    a semiconductor die mounted on the die pad;
    a plurality of leads in a first horizontal plane disposed along peripheral edges of the die pad;
    a ground bar downset from the first horizontal plane to a second horizontal plane between the leads and the die pad;
    a plurality of downset tie bars connecting the ground bar with the die pad;
    a plurality of digital ground wires and analog ground wires bonding to the ground bar, wherein at least one discontinuity is provided in the ground bar to separate the digital ground wires from the analog ground wires, so that the ground bar is separated by the discontinuity, the die pad defines four sides the digital ground wires, the analog ground wires and the discontinuity together are disposed on one side of die pad, wherein the digital ground wires and the analog ground wires are respectively connected to digital ground voltage pads and analog ground voltage pads of the semiconductor die; and
    a molding compound at least partially encapsulating the die pad, inner ends of the leads such that bottom surface of the die pad is exposed within the molding compound.

14. The semiconductor package according to claim 13 wherein a plurality of bonding wires are provided to connect the die pad with the ground bar.

15. The semiconductor package according to claim 14 wherein the bonding wires are bonded to a peripheral groove partially etched into the die pad.

16. A semiconductor package, comprising:
    a die pad;
    a semiconductor die mounted on the die pad;
    a plurality of leads disposed in a first horizontal plane and disposed along peripheral edges of the die pad;
    a ground bar downset from the first horizontal plane to a second horizontal plane between the leads and the die pad;
    a plurality of downset tie bars connecting the ground bar with the die pad;
    a plurality of bonding wires electrically connecting the die pad with the ground bar; and
    a molding compound at least partially encapsulating the die pad, inner ends of the leads such that bottom surface of the die pad is exposed within the molding compound.

17. The semiconductor package according to claim 16 further comprising a plurality of power or signal wires provided to connect power or signal pads on the semiconductor die to the leads.

* * * * *